United States Patent
Park et al.

(10) Patent No.: US 11,330,743 B2
(45) Date of Patent: May 10, 2022

(54) ELECTRONIC DEVICE INCLUDING STRUCTURE FOR PROTECTING DISPLAY DRIVER FROM STATIC ELECTRICITY

(71) Applicant: Samsung Electronics Co., Ltd., Suwon-si (KR)

(72) Inventors: Hyunjun Park, Suwon-si (KR); Seonghoon Kim, Suwon-si (KR); Hongkook Lee, Suwon-si (KR); Donghwy Kim, Suwon-si (KR); Jongkon Bae, Suwon-si (KR); Dongkyoon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 525 days.

(21) Appl. No.: 16/444,456

(22) Filed: Jun. 18, 2019

(65) Prior Publication Data
US 2020/0029475 A1     Jan. 23, 2020

(30) Foreign Application Priority Data

Jul. 20, 2018   (KR) .......................... 10-2018-0084495

(51) Int. Cl.
*H05K 9/00*        (2006.01)
*H05K 5/00*        (2006.01)
(Continued)

(52) U.S. Cl.
CPC ............ *H05K 9/0079* (2013.01); *G09G 3/20* (2013.01); *H05K 1/18* (2013.01); *H05K 5/0017* (2013.01);
(Continued)

(58) Field of Classification Search
CPC ...... H05K 9/0079; H05K 1/18; H05K 5/0017; H05K 2201/10128
(Continued)

(56) References Cited

U.S. PATENT DOCUMENTS 9,153,957 B2   10/2015   Yang et al.
9,736,931 B2   8/2017   Eom et al.
(Continued)

FOREIGN PATENT DOCUMENTS

CN      102803405 B      6/2016
CN      103633070 B      9/2017
(Continued)

OTHER PUBLICATIONS

International Search Report dated Nov. 5, 2019, issued in International Patent Application No. PCT/KR2019/007327.
(Continued)

*Primary Examiner* — Sherman Ng
(74) *Attorney, Agent, or Firm* — Jefferson IP Law, LLP

(57) ABSTRACT

An electronic device is provided. The electronic device includes a display panel, a metal layer disposed on a surface of the display panel, a display driver integrated circuit (DDI) disposed on a surface of the metal layer, a bending part connecting the display panel to the DDI, and a cover member connected to the metal layer while covering the DDI. The cover member includes at least one conductive layer. The metal layer and the cover member form a space in which the DDI is disposed, and the bending part is connected to the DDI via a connection part in the space.

20 Claims, 12 Drawing Sheets

(51) Int. Cl.
*H05K 1/18* (2006.01)
*G09G 3/20* (2006.01)

(52) U.S. Cl.
CPC .............. *G09G 2330/04* (2013.01); *H05K 2201/10128* (2013.01)

(58) Field of Classification Search
USPC ........................................................ 361/212
See application file for complete search history.

(56) References Cited

U.S. PATENT DOCUMENTS

| | | | |
|---|---|---|---|
| 9,858,883 | B2 | 1/2018 | Jeong |
| 10,485,101 | B2 | 11/2019 | Eom et al. |
| 10,490,770 | B2 | 11/2019 | Kim et al. |
| 10,963,079 | B2 | 3/2021 | Aoki et al. |
| 11,096,274 | B2 | 8/2021 | Eom et al. |
| 2004/0033384 | A1 | 2/2004 | Funkenbusch et al. |
| 2005/0247470 | A1 | 11/2005 | Fleming et al. |
| 2006/0035073 | A1 | 2/2006 | Busch et al. |
| 2010/0315105 | A1 | 12/2010 | Fornes |
| 2011/0014356 | A1 | 1/2011 | Fornes et al. |
| 2014/0042406 | A1 | 2/2014 | Degner et al. |
| 2014/0055892 | A1 | 2/2014 | Yang et al. |
| 2014/0078705 | A1* | 3/2014 | Jo .................. H05K 7/02 361/767 |
| 2016/0362565 | A1 | 12/2016 | Fornes et al. |
| 2017/0155245 | A1* | 6/2017 | Kim .................. G09G 5/00 |
| 2018/0076412 | A1 | 3/2018 | Kim et al. |
| 2018/0145278 | A1 | 5/2018 | Zhai |
| 2018/0150166 | A1 | 5/2018 | Aoki et al. |
| 2021/0216159 | A1 | 7/2021 | Aoki et al. |

FOREIGN PATENT DOCUMENTS

| | | |
|---|---|---|
| CN | 108121479 A | 6/2018 |
| EP | 2 778 773 A1 | 9/2014 |
| EP | 3 293 606 A1 | 3/2018 |
| KR | 10-2005-0097580 A | 10/2005 |
| KR | 10-0618085 B1 | 8/2006 |
| KR | 10-1607552 B1 | 3/2016 |
| WO | 2018/057652 A1 | 3/2018 |

OTHER PUBLICATIONS

Extended European Search Report dated Jun. 15, 2021, issued in European Patent Application No. 19837929.9.
Indian Examination Report dated Jul. 28, 2021, issued in Indian Patent Application No. 202017054295.

* cited by examiner

ELECTRONIC DEVICE INCLUDING STRUCTURE FOR PROTECTING DISPLAY DRIVER FROM STATIC ELECTRICITY

CROSS-REFERENCE TO RELATED APPLICATION(S)

This application is based on and claims priority under 35 U.S.C. § 119(a) of a Korean patent application number 10-2018-0084495, filed on Jul. 20, 2018, in the Korean Intellectual Property Office, the disclosure of which is incorporated by reference herein in its entirety.

BACKGROUND

1. Field

The disclosure relates to a technology for protecting a display driver integrated circuit (DDI) from static electricity generated inside or outside an electronic device.

2. Description of Related Art

An electronic device (e.g., a smart phone or a wearable device) may include a display that displays an image. The display may include a display panel and a DDI that supplies various signals and voltages to the display panel to drive the display panel.

In the meantime, static electricity may be generated in the electronic device due to a user's touch or external stimulation. The generated static electricity may be entered into the periphery of the DDI. In this case, the DDI may be damaged by the static electricity. Furthermore, electromagnetic interference (EMI) due to the static electricity may occur around the DDI of an electronic device.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a display driver integrated circuit (DDI) that is protected from static electricity generated inside or outside an electronic device.

A conventional electronic device may place a cover member to prevent a DDI from being affected by static electricity. The cover member may distribute static electricity along the cover member to block the static electricity entered into the DDI. However, the cover member for protecting the DDI needs to be positioned adjacent to the DDI in the electronic device. In this case, due to the static electricity, the path for discharging charge entered into the periphery of the DDI may be formed along the cover member. As such, the path for discharging the entered charge may be formed adjacent to at least one surface of the DDI. In this case, the DDI may be affected by the EMI due to the charge flow.

Moreover, the magnetic field due to the current flow may occur around the path for discharging the charge entered into the DDI. When a path for discharging the charge is formed adjacent to at least one surface of the DDI, the DDI may be affected by the magnetic field generated depending on charge flow. In particular, when the path for discharging the charge is formed adjacent to the logic block included in the DDI, the logic block may be affected by the magnetic field. When the logic block is affected by the magnetic field, an error may occur in image data provided by the logic block, thereby deteriorating the quality of the image.

Additional aspects will be set forth in part in the description which follows and, in part, will be apparent from the description, or may be learned by practice of the presented embodiments.

In accordance with an aspect of the disclosure, an electronic device is provided. The electronic device includes a display panel, a metal layer disposed on a surface of the display panel, a display driver integrated circuit (DDI) disposed on a surface of the metal layer, a bending part connecting the display panel to the DDI, and a cover member connected to the metal layer while covering the DDI. The cover member may include at least one conductive layer. The metal layer and the cover member may form a space in which the DDI is disposed, and the bending part may be connected to the DDI via a connection part in the space.

In accordance with another aspect of the disclosure, an electronic device is provided. The electronic device includes a display panel, a metal layer disposed on a surface of the display panel and electrically connected to a ground terminal of the electronic device, and one or more wires electrically connected to the display panel. The one or more wires may include a substrate layer electrically connected to a display driver integrated circuit (DDI) operating the display panel and a conductive layer disposed on at least part of the substrate layer and at least part of the metal layer while covering the DDI. The conductive layer may be electrically connected to at least part of the metal layer.

In accordance with another aspect of the disclosure, an electronic device is provided. The electronic device includes a display panel, a metal layer disposed on a surface of the display panel, a substrate layer disposed on a surface of the metal layer and electrically connected to the display panel, a bending part extending from one side of the display panel, surrounding one side of the metal layer, and connected to the substrate layer via a first portion of the surface of the metal layer, a display driver integrated circuit (DDI) disposed on the first portion, and a cover member covering the DDI. The cover member may be electrically connected to the metal layer, while being spaced from the DDI and the bending part.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
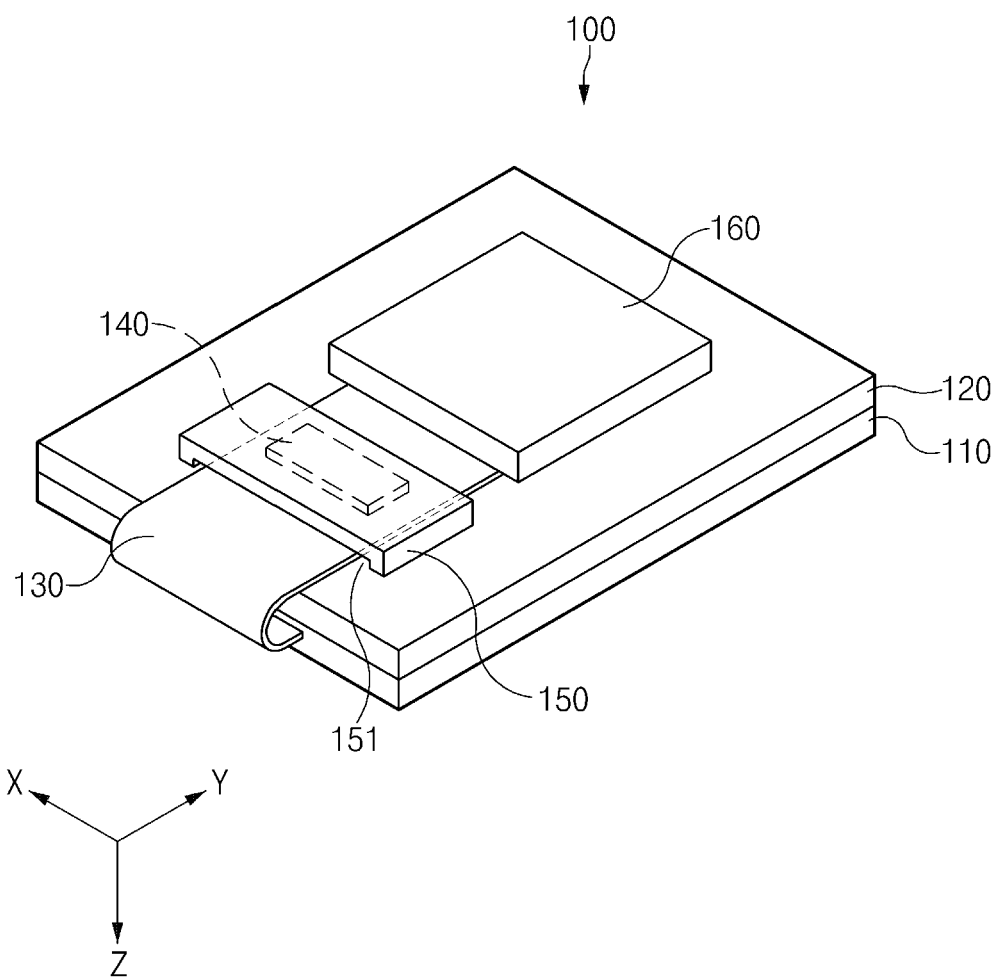
FIG. 1 is a perspective view of an electronic device, according to an embodiment of the disclosure.

FIG. 1 is a perspective view of an electronic device, according to an embodiment of the disclosure.

Referring to FIG. 1, an electronic device 100 may be a mobile device such as a smartphone. FIG. 1 illustrates the case where the electronic device 100 is viewed in a state where the electronic device 100 is turned over.

According to an embodiment, the electronic device 100 may include a display panel 110, a metal layer 120, a bending part 130, a display driver integrated circuit (DDI) 140, a cover member 150, and a substrate layer 160.

In an embodiment, the display panel 110 may display an image. The display panel 110 may include an active area for displaying an image. A plurality of pixels may be positioned in an active area. The plurality of pixels may be turned on by a gate voltage and may emit with a predetermined brightness based on the magnitude of a data voltage. A non-display area (bezel) may be positioned around the active area. The non-display area defines the border shape of the display panel 110 and may protect a plurality of pixels from impact.

In an embodiment, the metal layer 120 may be disposed on one surface of the display panel 110. The metal layer 120 may be attached to a surface opposite to the surface for display an image, from among two surface of the display panel 110 formed in the Z-axis direction.

In an embodiment, one side of the display panel 110 may be connected to the bending part 130. For example, the bending part 130 may be coupled to one side of the display panel 110. Alternatively, the bending part 130 may extend from one side of the display panel 110.

In an embodiment, the metal layer 120 may be disposed on the lower surface of the display panel 110 with respect to the Z-axis direction. The metal layer 120 may be disposed to be in contact with one surface of the display panel 110. The metal layer 120 may be a ground layer that operates as the ground (GND) of the electronic device 100. The metal layer 120 may be implemented with a metal plate (e.g., copper (Cu) sheet or graphite). The metal layer 120 may block electromagnetic waves that come from or go to the display panel 110. According to an embodiment, the metal layer 120 may disperse the heat from the display panel 110.

In an embodiment, the bending part 130 may connect the display panel 110 to the DDI 140. The bending part 130 may include a plurality of wires. The plurality of wires may electrically connect the pixels of the display panel 110 to the DDI 140.

In an embodiment, the bending part 130 may be connected to the edge of one side of the display panel 110. The bending part 130 may be bended at one side edge of the display panel 110 in the direction of the rear surface of the display panel 110. The bending part 130 may extend from the display panel 110 and at least part of an area may be bent.

In an embodiment, the bending part 130 may be disposed in at least the partial area of the upper surface or the lower surface of the metal layer 120, while surrounding one side of the metal layer 120. After being bended to the rear surface of the metal layer 120, the bending part 130 may extend parallel to the metal layer 120.

In an embodiment, the DDI 140 may be disposed on one surface of the bending part 130. The DDI 140 may be in contact with one surface of the bending part 130. For example, the DDI 140 may be disposed on an area extending to the rear surface of the display panel 110, in the bending part 130.

In an embodiment, the DDI 140 may be disposed on one surface of the bending part 130. The DDI 140 may be disposed on the opposite side of the display panel in one surface of the metal layer 120.

In an embodiment, the DDI 140 may be electrically connected to lines positioned on the display panel 110. For example, the DDI 140 may be connected to gate lines and data lines which are disposed to cross each other on the active area of the display panel 110. The DDI 140 may output a gate signal by using a gate line. The DDI 140 may supply data voltage, using a gate line. The DDI 140 may emit pixels connected to gate lines and data lines.

In an embodiment, the cover member 150 may cover the DDI 140. The cover member 150 may cover at least one or more surfaces of the DDI 140. For example, the cover member 150 may cover at least part of the upper surface and side surface of the DDI 140. The cover member 150 may overlap with the whole upper surface of the DDI 140.

In an embodiment, the cover member 150 may be connected to the metal layer 120. For example, the cover member 150 may include an upper surface parallel to the metal layer 120 and a side surface for connecting the upper surface to the metal layer 120. For another example, the cover member 150 may be connected to the metal layer 120 while being bended and then extending on one surface of the metal layer 120. As such, the shape of the cover member 150 may be a rectangular shape, an arch shape, or a dome shape with respect to the Y axis direction.

In an embodiment, the upper surface of the cover member 150 may at least partly overlap with one surface of the metal layer 120. For example, the cover member 150 may at least partly overlap with the metal layer 120 on an area on which the bending part 130 extends to the rear surface of the display panel 110.

In an embodiment, the metal layer 120 and the cover member 150 may form a space. As the cover member 150 covers the one surface of the metal layer 120, the space may be formed between one surface of the metal layer 120 and the cover member 150. The DDI 140 may be disposed in the space formed by the metal layer 120 and the cover member 150.

In an embodiment, at least one connection part 151 (e.g., a connection area) may be present in the space formed by the metal layer 120 and the cover member 150. The at least one connection part 151 may be an area in the space. For example, the at least one connection part 151 may be present on one side surface of the cover member 150. However, an embodiment is not limited thereto, and the at least one connection part 151 may be present on at least part of the surface of the cover member 150.

In an embodiment, the cover member 150 may shield the DDI 140 substantially (e.g., preferably completely). The cover member 150 may be attached over the DDI 140. The DDI 140 may be disposed in the space formed by the cover member 150 and the metal layer 120, without space. The at least one connection part 151 may not open the DDI 140 in the space formed by the cover member 150 and the metal layer 120. The at least one connection part 151 may not generate a gap on one surface of the metal layer 120. The cover member 150 may be formed of a flexible material so as not to generate a gap. For example, the cover member 150 may be formed of a flexible material such as pet, acrylic, carbon, powder, or fabric so as to be formed along the surface of the DDI 140.

In an embodiment, the bending part 130 may be connected to the DDI 140 via the at least one connection part 151 in the space. The cover member 150 may be attached over the bending part 130. The cover member 150 may substantially (e.g., preferably completely) seal the DDI 140 disposed on the bending part 130, while covering the bending part 130. For example, as illustrated in FIG. 1, the bending part 130 may be inserted in the Y-axis direction via the at least one connection part 151 on the cover member 150 and then may be connected to the DDI 140. However, an embodiment is not limited thereto, and the bending part 130 may be connected to the DDI 140 via the at least one connection part 151 on the cover member 150.

In an embodiment, the DDI 140 may be disposed spaced from the metal layer 120. Because the DDI 140 is disposed on one surface of the bending part 130, the bending part 130 may be interposed between the DDI 140 and the metal layer 120. In a state where the DDI 140 is not in contact with the metal layer 120, the DDI 140 may be connected to the bending part 130.

In an embodiment, the cover member 150 may be in contact with the metal layer 120 at least one point. The cover member 150 may be in contact with the metal layer 120 at a plurality of points, lines, or areas. The cover member 150 may be in contact with the metal layer 120 in the whole border area other than the at least one connection part 151 into which the bending part 130 is inserted.

In an embodiment, the substrate layer (M-FPC) 160 may be connected to the bending part 130. The substrate layer 160 may be disposed on one surface of the metal layer 120. The bending part 130 may extend on one surface of the metal layer 120 in parallel and may be connected to the substrate layer 160.

In an embodiment, the substrate layer 160 may be electrically connected to the display panel 110 via the bending part 130. The substrate layer 160 may include one or more wires. The one or more wires may constitute a PCB wire and a PCB circuit inside the substrate layer 160.

In an embodiment, an integrated circuit chip (IC chip) constituting the PCB wire and the PCB circuit may be mounted inside the substrate layer 160. The IC chip may be electrically connected to one or more wires. The IC chip may generate various signals and voltages used for the display panel 110 to display an image. When generating various signals and voltages, the IC chip may designate the voltage of the metal layer 120 as a ground voltage.

In an embodiment, one or more wires may be electrically connected to the DDI 140 via the bending part 130. Because the DDI 140 is electrically connected to the pixels of the display panel 110, the one or more wires may be electrically connected to the display panel 110. The one or more wires may transmit or receive information to or from at least part of the display panel 110. The one or more wires may transmit various signals and voltages generated by the IC chip, to the display panel 110.

In an embodiment, the substrate layer 160 may be electrically connected to the display panel 110. The substrate layer 160 may extend to be in contact with at least part of the edge of the display panel 110. The substrate layer 160 may extend in at least one or more directions of the X-axis direction and Y-axis direction, on the rear surface of the metal layer 120. The substrate layer 160 may supply various signals and voltages to the DDI 140 via the bending part 130.

Figure 2:
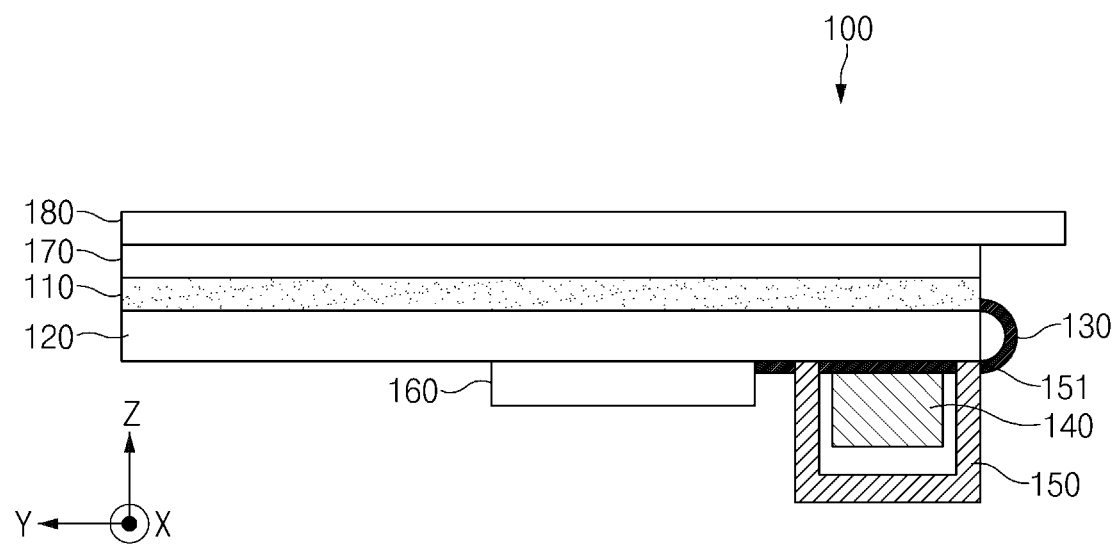
FIG. 2 is a view illustrating one side surface of an electronic device, according to an embodiment of the disclosure.

FIG. 2 is a view illustrating one side surface of an electronic device, according to an embodiment of the disclosure. FIG. 2 illustrates the electronic device 100 when viewed in the X-axis direction.

Referring to FIG. 2, the electronic device 100 may include the display panel 110, the metal layer 120, the bending part 130, the DDI 140, the cover member 150, the substrate layer 160, a touch panel 170, and a cover glass 180.

In an embodiment, one side of the display panel 110 may be connected to the bending part 130. At least part of one side of the display panel 110 may be coupled to one side of the bending part 130.

In an embodiment, the metal layer 120 may be disposed on one surface of the display panel 110. The metal layer 120 may be disposed on the lower surface of the display panel 110 with respect to the Z-axis. The touch panel 170 may be disposed on a surface, which is opposite to the surface on which the metal layer 120 is disposed, from among both surfaces of the display panel 110.

In an embodiment, the touch panel 170 may be disposed on the upper surface of the display panel 110. The touch panel 170 may detect a user's touch. The touch panel 170 may be a touch screen panel operating in the on-cell scheme composed of a plurality of touch electrodes. The cover glass 180 may be disposed on one surface of the touch panel 170.

In an embodiment, the cover glass 180 may be disposed on the upper surface of the touch panel 170. The cover glass 180 may protect the display panel 110 and the touch panel 170 from external impact. The cover glass 180 may be formed of glass, reinforced plastic, or a flexible polymer material.

In an embodiment, the bending part 130 may connect the display panel 110 to the DDI 140. The bending part 130 may be bended at the edge of one side of the display panel 110 in the direction of the rear surface of the display panel 110.

In an embodiment, the bending part 130 may be disposed in at least the partial area of the upper surface or the lower surface of the metal layer 120, while surrounding one side of the metal layer 120. After being in contact with the rear surface of the metal layer 120 in the rear surface direction of the display panel 110, the bending part 130 may extend along the metal layer 120.

In an embodiment, the DDI 140 may be disposed on the area extending to the rear surface of the display panel 110 in one surface of the bending part 130. The edge extending to the rear surface of the display panel 110 in one side of the bending part 130 may be connected to the substrate layer 160. The bending part 130 may include a plurality of wires. The plurality of wires may electrically connect the pixels of the display panel 110 to the DDI 140. The plurality of wires may electrically connect the DDI 140 to the substrate layer 160.

In an embodiment, the cover member 150 may cover the DDI 140. The cover member 150 may overlap with the whole DDI 140.

In an embodiment, the edge of the cover member 150 may be connected to the metal layer 120. The metal layer 120 and the cover member 150 may form a space. As the cover member 150 covers the one surface of the metal layer 120, the space may be formed between one surface of the metal layer 120 and the cover member 150. However, an embodiment is not limited thereto, and a layer formed of a material having non-conductive features may be disposed over the DDI 140 and the cover member 150. The DDI 140 may be disposed in the space formed by the metal layer 120 and the cover member 150.

In an embodiment, the DDI 140 may be connected to the bending part 130, using the at least one connection part 151 (e.g., a connection area) on the cover member 150. For example, the DDI 140 may be connected to the bending part 130, using the at least one connection part 151 of at least part of the area of the side surface of the cover member 150. Hereinafter, an embodiment is not limited thereto. The at least one connection part 151 for opening the space formed by the metal layer 120 and the cover member 150 may not be present on the side surface of the cover member 150. Alternatively, the at least one connection part 151 formed of one or more open structures or open areas may be on the side surface of the cover member 150.

In an embodiment, the DDI 140 may be disposed spaced from the cover member 150. The volume of the space formed by the metal layer 120 and the cover member 150 may be greater than the volume of the DDI 140. Furthermore, even though the DDI 140 is mounted on the bending part 130, the DDI 140 may be spaced from the inner surface of the cover member 150. In a state where the DDI 140 is not in contact with the cover member 150, the DDI 140 may be connected to the bending part 130.

In an embodiment, the cover member 150 may be in contact with the metal layer 120 at at least one point. The cover member 150 may be in contact with the metal layer 120 at a point other than at least one point into which the bending part 130 is inserted.

Figure 3:
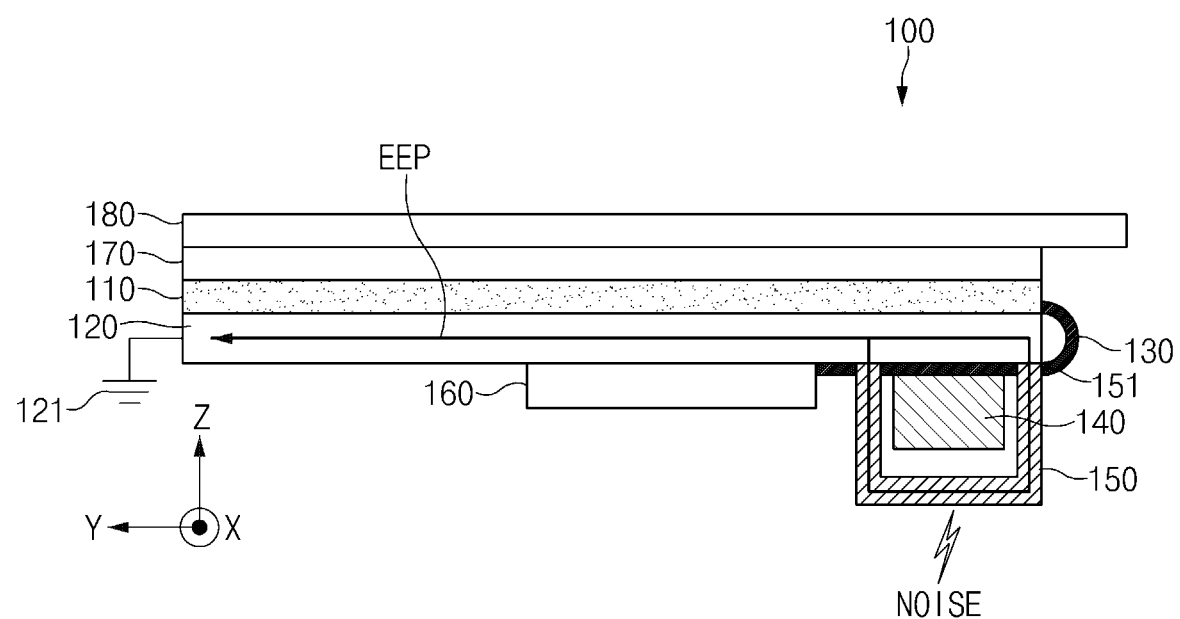
FIG. 3 is a view illustrating an electrostatic path of an electronic device, according to an embodiment of the disclosure.

FIG. 3 is a view illustrating an electrostatic path (EEP) of an electronic device, according to an embodiment of the disclosure.

Referring to FIG. 3, the cover member 150 may include at least one conductive layer. Charge may be entered in the cover member 150 due to a phenomenon of electrostatic discharge (ESD) according to external noise. The cover member 150 may discharge the charge entered using at least one conductive layer, to the metal layer 120. The cover member 150 may protect the DDI 140 from electrical shock due to the effect according to the noise and the entered charge.

In an embodiment, the EEP may go via at least one point at which the cover member 150 and the metal layer 120 are connected. The at least one point at which the cover member 150 and the metal layer 120 are connected may be spaced from the DDI 140 by a specified distance. In addition, one surface of the metal layer 120 may be space from one surface of the DDI 140 by a specified distance or more. As such, the EEP may be spaced from the DDI 140 by a specified distance or more.

In an embodiment, when the charge is discharged to the metal layer 120 by using the EEP, magnetic field (B-field) may be formed at a periphery of the EEP. When the DDI 140 is exposed to the magnetic field by the EEP, an error may occur in image data in the digital format owned by the DDI 140, due to EMI.

In an embodiment, when the EEP goes via at least one point at which the cover member 150 and the metal layer 120 are connected, the EEP may be formed spaced from the DDI 140. In more detail, the EEP may be spaced from a logic block 141 of FIG. 10 and a gamma block 142 of FIG. 10 included in the DDI 140. When the EEP is not adjacent to the DDI 140, the DDI 140 may not be affected by the magnetic field. As such, the DDI 140 may prevent an error from occurring in image data in the digital format.

In an embodiment, the EEP may connect the cover member 150 to the metal layer 120. After facing from the cover member 150 to the metal layer 120, the charge flowing into EEP may face from the metal layer 120 to a ground terminal 121. The metal layer 120 may discharge the charge entered from the cover member 150, to the ground terminal 121. The electrostatic path EEP may not go via the substrate layer 160.

In an embodiment, when the EEP goes via the substrate layer 160, the error may occur in the signal, which is generated by the substrate layer 160 or signals transmitted via the substrate layer 160 because the substrate layer 160 is exposed to magnetic field.

In an embodiment, after the EEP facing from the cover member 150 to the metal layer 120, when the EEP faces from the metal layer 120 to the ground terminal 121, the EEP may be formed spaced from the substrate layer 160. In more detail, the EEP may be spaced from the area of a wire(s) 162 of FIG. 8 included in the substrate layer 160. When the EEP is not adjacent to the substrate layer 160, the substrate layer 160 may not be affected by the magnetic field. As such, it is possible to prevent an error from occurring in signals generated by the substrate layer 160.

Figure 4:
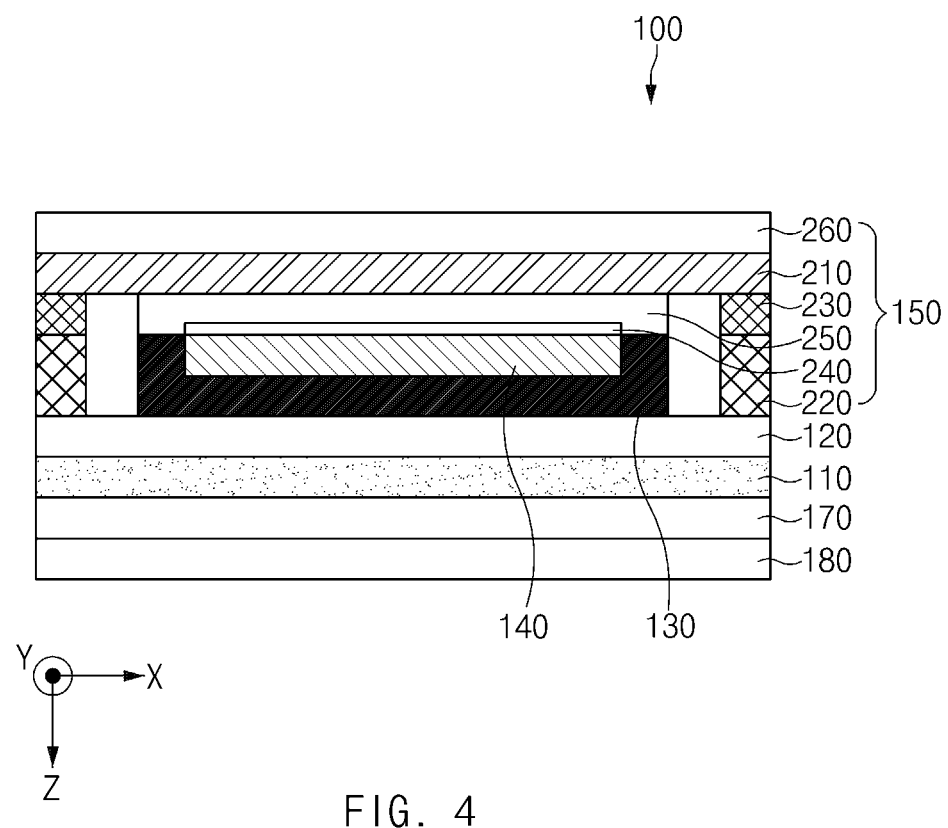
FIG. 4 is a view illustrating another side surface of an electronic device, according to an embodiment of the disclosure.

FIG. 4 is a view illustrating another side surface of an electronic device, according to an embodiment of the disclosure. FIG. 4 illustrates the electronic device 100 of FIG.

1 when viewed in the Y-axis direction. As illustrated in FIG. 1, FIG. 4 illustrates the case where the electronic device 100 is viewed in a state where the electronic device 100 is turned over.

Referring to FIG. 4, the cover member 150 may be disposed on at least part of one surface of each of the bending part 130, the metal layer 120, and the DDI 140. The cover member 150 may include a first conductive layer 210, a second conductive layer 220, a third conductive layer 230, an adhesive layer 240, an insulating layer 250, and a light-shielding layer 260.

In an embodiment, the first conductive layer 210 may extend from an upper portion of one side of the metal layer 120 to upper portion of the other side of the metal layer 120. The first conductive layer 210 may have the same length, width, or height as the metal layer 120, with respect to at least one surface. For example, the first conductive layer 210 may have the same as the metal layer 120 with respect to the X-axis direction. However, an embodiment is not limited thereto. The width of the first conductive layer 210 that is a length in X-axis direction of the first conductive layer 210 may be less than or equal to that of the metal layer 120.

In an embodiment, the first conductive layer 210 may seal the DDI 140 substantially (e.g., preferably completely). As such, the width of the first conductive layer 210 may be greater than or equal to that of the DDI 140.

In an embodiment, the first conductive layer 210 may be disposed spaced from the DDI 140. The first conductive layer 210 may extend in at least one direction to be longer than the bending part 130. For example, the length in the X-axis direction of the first conductive layer 210 may be longer than the length in the X-axis direction of the bending part 130.

In an embodiment, at least part of the area of the first conductive layer 210 may be connected to the second conductive layer 220 or the third conductive layer 230. For example, the first conductive layer 210 may be connected to the second conductive layer 220 or the third conductive layer 230 at the edges of the opposite sides extending in the X-axis direction to be longer than the bending part 130. However, an embodiment is not limited thereto. The first conductive layer 210 may be connected to the second conductive layer 220 or the third conductive layer 230 while bypassing the DDI 140.

In an embodiment, the second conductive layer 220 may be in contact with at least part of one surface of the metal layer 120. For example, the second conductive layer 220 may be in contact with one surface of the metal layer 120 on an edge area spaced from the bending part 130 in the X-axis direction, on one surface of the metal layer 120. However, an embodiment is not limited thereto. The second conductive layer 220 may be in contact with one surface of the metal layer 120, on at least one point spaced from the DDI 140. A conductive adhesive layer may be formed in a portion in which the second conductive layer 220 and the metal layer 120 are in contact with each other.

In an embodiment, the second conductive layer 220 may be disposed spaced from the DDI 140. The second conductive layer 220 may be disposed spaced from the bending part 130.

In an embodiment, the third conductive layer 230 may be interposed between the first conductive layer 210 and the second conductive layer 220. The third conductive layer 230 may connect the first conductive layer 210 to the second conductive layer 220.

In an embodiment, the first conductive layer 210, the second conductive layer 220, and the third conductive layer 230 may be formed integrally. The first conductive layer 210, the second conductive layer 220, and the third conductive layer 230 may be formed of the same material.

In an embodiment, the adhesive layer 240 may be provided on one surface of the DDI 140. The adhesive layer 240 may fix a space between the DDI 140 and the cover member 150. The adhesive layer 240 may prevent the cover member 150 from moving on the DDI 140 or deviating off the DDI 140.

In an embodiment, the insulating layer 250 may be provided on one surface of the adhesive layer 240 and the bending part 130. The insulating layer 250 may physically and electrically separate the DDI 140 from the first conductive layer 210. The insulating layer 250 may fill the gap formed between the DDI 140 and the cover member 150. The insulating layer 250 may allow the DDI 140 and the cover member 150 to be close to each other.

In an embodiment, the light-shielding layer 260 may be provided on the upper surface of the first conductive layer 210. The light-shielding layer 260 may be formed of the mixture of an insulating material (e.g., PET) and a light-shielding material (e.g., carbon black). Alternatively, the light-shielding layer 260 may be formed by stacking layers separately formed of an insulating material and a light-shielding material. The light-shielding material may block the transmission of ultraviolet (UV). As such, the light-shielding layer 260 may prevent UV from penetrating to the DDI 140.

Figure 5:
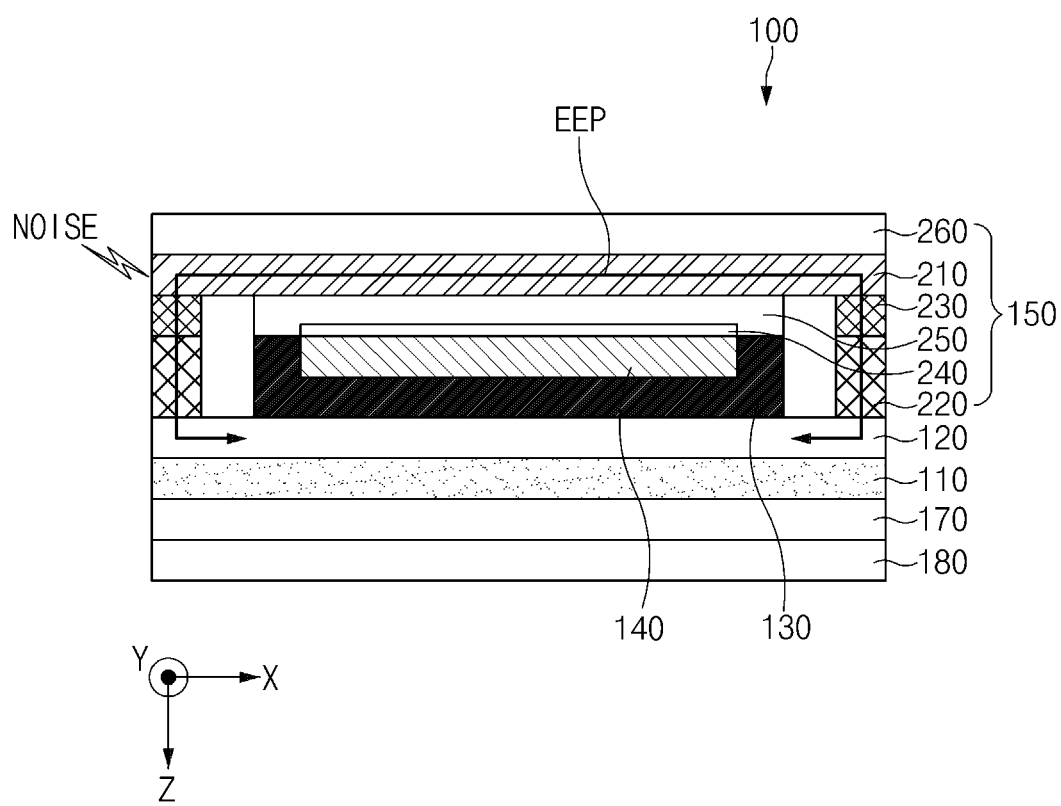
FIG. 5 is a view illustrating an electrostatic path of an electronic device, according to an embodiment of the disclosure.

FIG. 5 is a view illustrating an EEP of an electronic device, according to an embodiment of the disclosure.

Referring to FIG. 5, the charge may be entered into the first conductive layer 210, due to ESD phenomenon according to the external noise. The second conductive layer 220 and the third conductive layer 230 may electrically connect the first conductive layer 210 to the metal layer 120. The first conductive layer 210 may discharge the entered charge to the metal layer 120, using the second conductive layer 220 and the third conductive layer 230. The first conductive layer 210 may protect the DDI 140 from electrical shock due to the effect according to the noise and the entered charge.

In an embodiment, when the noise occurs, the EEP may start from the first conductive layer 210 and then may face to the metal layer 120 via the third conductive layer 230 and the second conductive layer 220. The EEP may be formed along the metal layer 120. For example, the EEP may be formed to extend in the X-axis and Y-axis directions from at least one point on the metal layer 120 that is in contact with the second conductive layer 220, in parallel with the metal layer 120.

In an embodiment, the EEP may not go via the DDI 140. The EEP may be spaced from the DDI 140 by a gap between the insulating layer 250 or the DDI 140 and the second conductive layer 220 and the third conductive layer 230. As such, the EEP may minimize the effect on the DDI 140.

Figure 6:
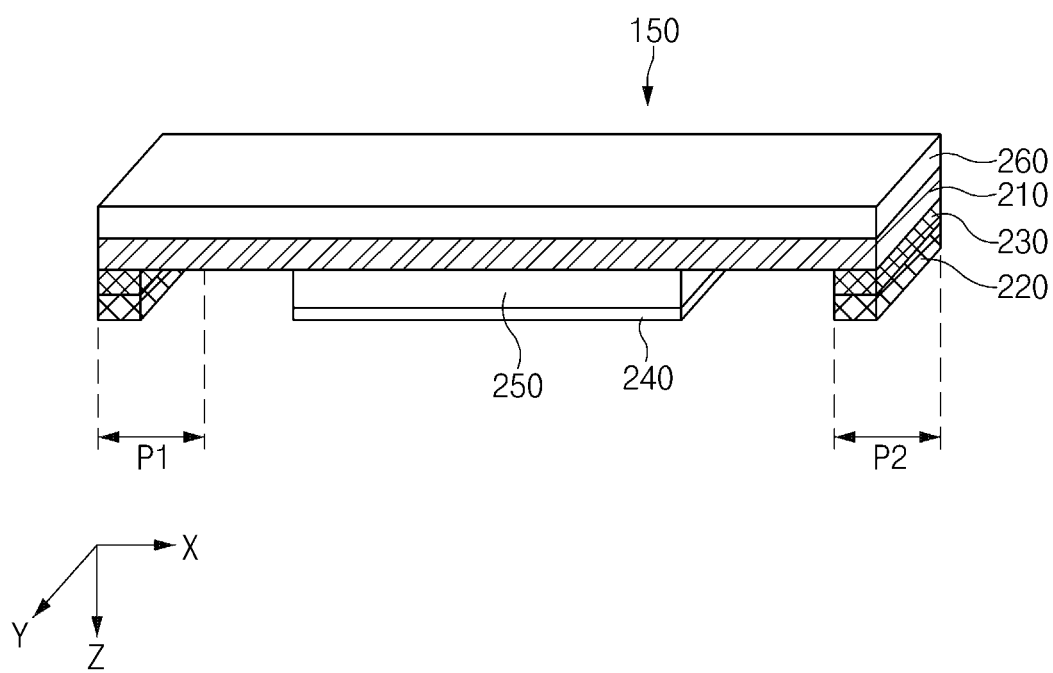
FIG. 6 is a view illustrating a cover member, according to an embodiment of the disclosure.

FIG. 6 is a view illustrating a cover member, according to an embodiment of the disclosure. The cover member 150 may include the first conductive layer 210, the second conductive layer 220, the third conductive layer 230, the adhesive layer 240, the insulating layer 250, and the light-shielding layer 260.

Referring to FIG. 6, the first conductive layer 210 may extend from a first point P1 to a second point P2. Each of the first point P1 and the second point P2 may be a point at which the second conductive layer 220 and the third conductive layer 230 are disposed. Each of the first point P1 and the second point P2 may be a point at which the adhesive layer 240 and the insulating layer 250 are not disposed.

In an embodiment, the first conductive layer 210 may be made of a metal layer composed of one or more conductive materials. The conductive material may be a metal capable of easily transferring charge because the electrical conductivity of the conductive material is not less than a specific level. For example, the conductive material may be a metal having the resistivity of $10^{-8}$ Ω·m or more and $10^{-7}$ Ω·m or less, such as copper (Cu), nickel (Ni), gold (Au), silver (Ag), or aluminum (Al).

In an embodiment, the first conductive layer 210 may include a fabric-type material having ductility. When the first conductive layer 210 includes the fabric-type material, the ductility of the first conductive layer 210 may increase.

In an embodiment, the first conductive layer 210 may have a structure in which a mixed layer obtained by mixing one or more conductive materials and adhesive and one or more metal layers are stacked. For example, the first conductive layer 210 may have a three-layer structure in which the mixed layer, the metal layer, and the mixed layer are stacked sequentially. When the first conductive layer 210 includes the mixed layer, the separate adhesive layer 240 may be omitted.

In an embodiment, the thickness of the first conductive layer 210 may not be less than 10 μm and may not be greater than 20 μm. In more detail, the thickness of the first conductive layer 210 may be formed as about 18 μm.

In an embodiment, the second conductive layer 220 may be disposed on the edge area of the first conductive layer 210. For example, the second conductive layer 220 may be disposed at the first point P1, which is an area provided at the edge of one side in the X-axis direction and the second point P2, which is an area provided at the edge of the other side in the X-axis direction, in an area in which the first conductive layer 210 is disposed. However, an embodiment is not limited thereto. The second conductive layer 220 may be disposed on at least the partial area of an edge area, in an area in which the first conductive layer 210 is disposed.

In an embodiment, the second conductive layer 220 may have a structure in which a mixed layer obtained by mixing one or more conductive materials and adhesive and one or more metal layers are stacked. The original stage type of the metal layer may be the form of a fabric, powder, or rigid.

In an embodiment, the second conductive layer 220 may be formed to be thicker than the first conductive layer 210. For example, the thickness of the second conductive layer 220 may not be less than 10 μm and may not be greater than 40 μm.

In an embodiment, the third conductive layer 230 may be disposed on the second conductive layer 220. The third conductive layer 230 may connect the first conductive layer 210 to the second conductive layer 220.

In an embodiment, the third conductive layer 230 may have a structure in which a mixed layer obtained by mixing one or more conductive materials and adhesive and one or more metal layers are stacked. The original stage type of the metal layer may be the form of a fabric, powder, or rigid.

In an embodiment, the third conductive layer 230 may be formed to be thicker than the first conductive layer 210. The third conductive layer 230 may be formed to be thinner than the second conductive layer 220. For example, the thickness of the third conductive layer 230 may not be less than 10 μm and may not be greater than 30 μm.

In an embodiment, the adhesive layer 240 may be formed using non-conductive adhesive. For example, the adhesive layer 240 may be made of an acrylic adhesive.

In an embodiment, the adhesive layer 240 may be formed to be thinner than the first conductive layer 210. For example, the thickness of the adhesive layer 240 may not be less than 1 μm and may not be greater than 10 μm.

In an embodiment, the insulating layer 250 may be provided on the upper surface of the adhesive layer 240. The insulating layer 250 may be formed of a non-conductive material. For example, the insulating layer 250 may be formed of polyethylene terephthalate (PET).

In an embodiment, the insulating layer 250 may be formed to be thicker than the first conductive layer 210. The insulating layer 250 may be formed to be thicker than the adhesive layer 240. For example, the thickness of the insulating layer 250 may not be less than 10 μm and may not be greater than 30 μm.

In an embodiment, the light-shielding layer 260 may be provided over the first conductive layer 210. The light-shielding layer 260 may be formed by mixing a light-shielding material for shielding light with a non-conductive material. The light blocked by the light-shielding layer 260 may be UV. For example, the light-shielding layer 260 may be formed of a material obtained by mixing PET and carbon black. The light-shielding layer 260 may have a structure in which an insulating layer made of a non-conductive material and a light-shielding layer made of a light-shielding material are stacked sequentially.

In an embodiment, the light-shielding layer 260 may be formed to be thicker than the adhesive layer 240. For example, the thickness of the light-shielding layer 260 may not be less than 10 μm and may not be greater than 20 μm. The light-shielding layer 260 may be formed to be thinner than the first conductive layer 210. In more detail, the thickness of the light-shielding layer 260 may be formed as about 12 μm.

In an embodiment, the first conductive layer 210 may extend to be longer than the adhesive layer 240 and the insulating layer 250. The area size of the first conductive layer 210 may be wider than the area size of the adhesive layer 240 and the area size of the insulating layer 250. For example, the first conductive layer 210 may extend in the X-axis direction to be longer than the adhesive layer 240 and the insulating layer 250.

In an embodiment, the second conductive layer 220 may be in contact with the metal layer 120. The third conductive layer 230 may be interposed between the first conductive layer 210 and the second conductive layer 220. The third conductive layer 230 may be disposed to overlap with the second conductive layer 220. The second conductive layer 220 and the third conductive layer 230 may not overlap with the adhesive layer 240 and the insulating layer 250.

In an embodiment, the height of the upper surface of the third conductive layer 230 may be the same as the height of the upper surface of the insulating layer 250. The height of the upper surface of an area in which the adhesive layer 240 and the insulating layer 250 are disposed may be higher than the height of the upper surface of the second conductive layer 220 at the first point P1 and the second point P2, by the height of the DDI 140. The third conductive layer 230 may compensate for the step between the first point P1 and the second point P2, at each of which the second conductive layer 220 is disposed, and an area in which the adhesive layer 240 and the insulating layer 250 are disposed.

Figure 7:
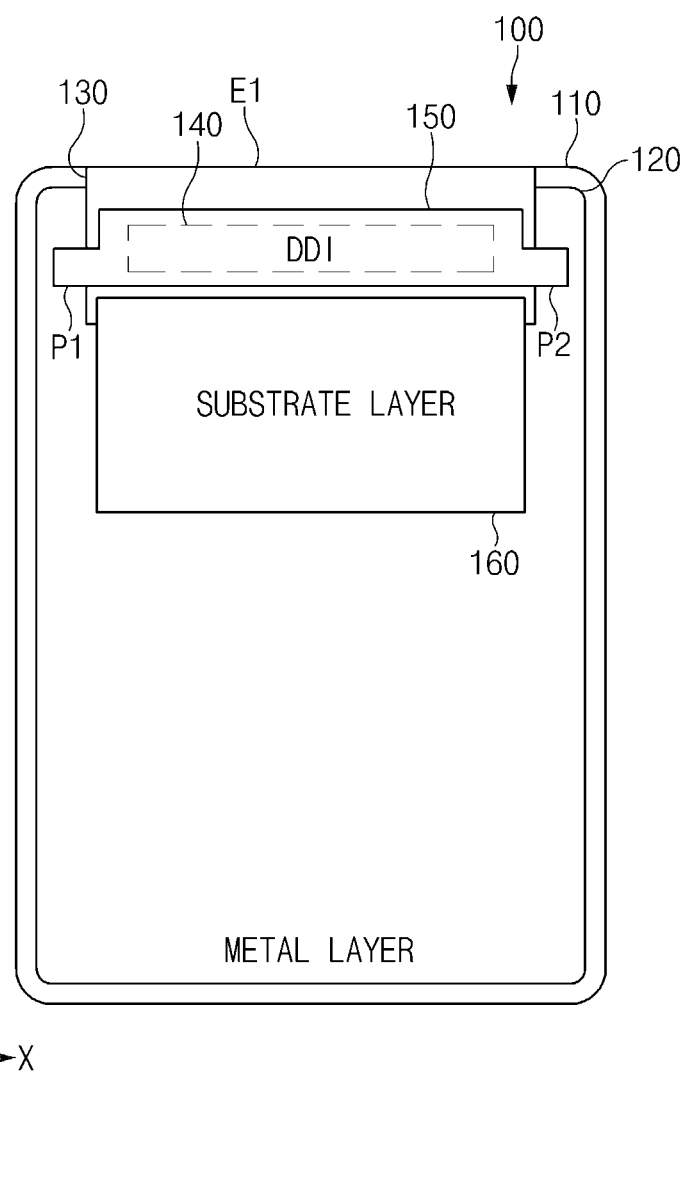
FIG. 7 is a rear view of an electronic device, according to an embodiment of the disclosure.

FIG. 7 is a rear view of an electronic device, according to an embodiment of the disclosure.

Referring to FIG. 7, the external periphery of the non-display area of the display panel 110 may include a first edge E1. The first edge E1 may be defined as a side adjacent to the DDI 140 in the external periphery of the non-display area.

In an embodiment, the bending part 130 may be disposed to surround the first edge E1 of the display panel 110. The bending part 130 may be bended in the rear surface direction of the electronic device 100 at the first edge E1. While surrounding one side edge of the metal layer 120, the bending part 130 may be bended to the rear surface of the display panel 110. After being bended to the rear surface direction of the display panel 110, the bending part 130 may extend in parallel with the display panel 110.

In an embodiment, the cover member 150 may be in contact with the metal layer 120 at at least one point (e.g., the first point P1 or the second point P2) that does not overlap with the DDI 140. For example, the cover member 150 may be in contact with the metal layer 120 at the at least one point (e.g., the first point P1 or the second point P2) that extends in the X-axis direction by a specified length to be longer than the DDI 140. However, an embodiment is not limited thereto. The cover member 150 may have a protrusion extending not to overlap with the DDI 140 and the bending part 130 in a periphery area and may be connected to the metal layer 120 through the extended protrusion.

In an embodiment, the cover member 150 may extend from the edges of the opposite sides to the outside of the DDI 140 and the bending part 130. For example, while extending in the direction in parallel with the first edge E1, the cover member 150 may extend toward the outside of the DDI 140 and the bending part 130. Opposite sides of the cover member 150 may extend in the direction opposite to each other by 180°. However, an embodiment is not limited thereto. At least part of the edge of the cover member 150 may extend toward the outside of the DDI 140 and the bending part 130.

In an embodiment, at least part of the cover member 150 may be in contact with the metal layer 120. The cover member 150 may be electrically connected to the metal layer 120, using a portion with which the metal layer 120 is in contact. The cover member 150 may transmit the charge entered due to ESD phenomenon, to the metal layer 120 by using the portion with which the metal layer 120 is in contact. When the charge is entered into the periphery of the DDI 140 after static electricity is generated due to a user's touch or external stimulus, the cover member 150 may discharge the entered charge to the metal layer 120. The cover member 150 may form an electrostatic path for connecting the cover member 150 to the metal layer 120, using the portion with which the metal layer 120 is in contact.

In an embodiment, the cover member 150 may cover the surface of the DDI 140. The cover member 150 may overlap with the DDI 140. The cover member 150 may have the area size wider than that of the DDI 140.

In an embodiment, a portion in which the cover member 150 and the metal layer 120 are in contact with each other may be spaced from the DDI 140.

In an embodiment, the cover member 150 may not overlap with the substrate layer 160. The cover member 150 may be electrically separated from the bending part 130 and the substrate layer 160. The cover member 150 may form the EEP so as not to go via the bending part 130 and the substrate layer 160.

Figure 8:
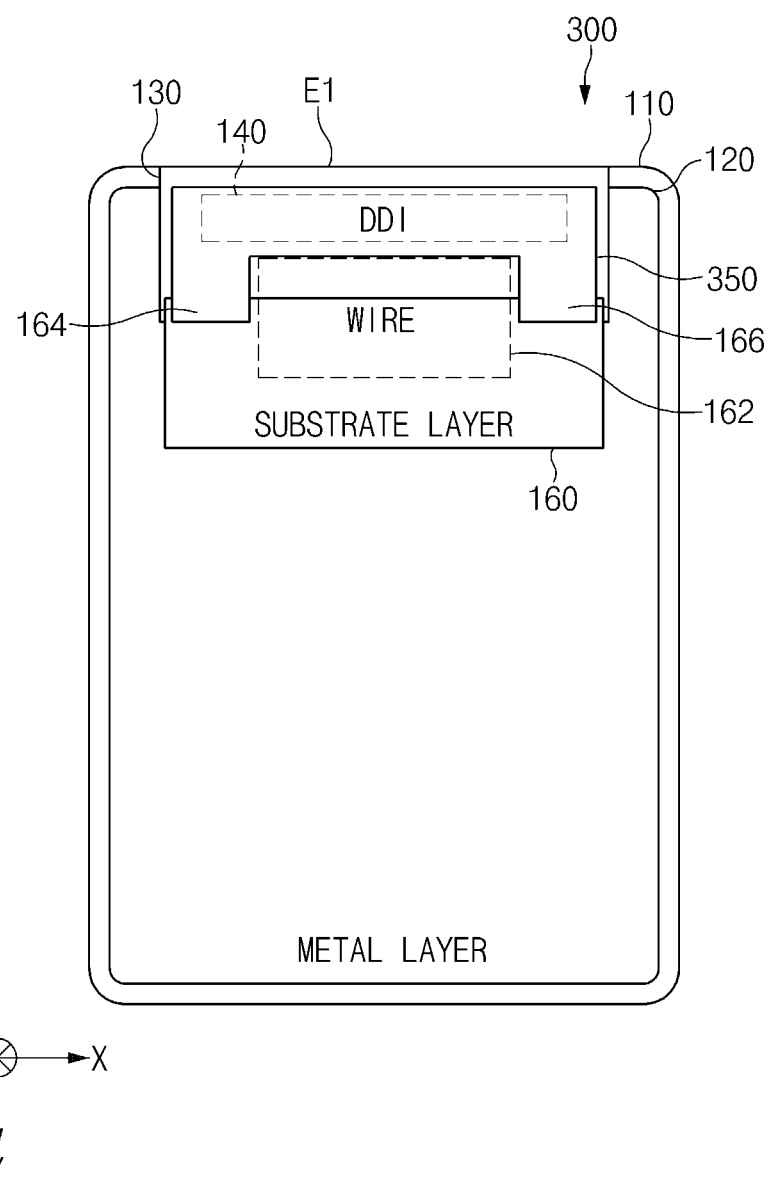
FIG. 8 is a rear view of an electronic device, according to an embodiment of the disclosure.

FIG. 8 is a rear view of an electronic device according to an embodiment of the disclosure.

Referring to FIG. 8, an electronic device 300 may include the display panel 110, the metal layer 120, the bending part 130, the DDI 140, a cover member 350, and the substrate layer 160. According to another embodiment, because the display panel 110, the metal layer 120, the bending part 130, and the DDI 140 are substantially the same as the display panel 110, the metal layer 120, the bending part 130, and the DDI 140 of the electronic device 100 according to an embodiment, the descriptions thereof may be omitted.

In an embodiment, the cover member 350 may be disposed over at least part of the substrate layer 160 and at least part of the metal layer 120. The cover member 350 may include at least one conductive layer. The conductive layer may be electrically connected to at least part of the metal layer 120.

In an embodiment, the cover member 350 may cover the DDI 140. The conductive layer of the cover member 350 may cover the DDI 140. For example, the conductive layer may cover the upper surface and at least part of a side surface of the DDI 140.

In an embodiment, the cover member 350 may further include an insulating layer on the area with which the DDI 140 is in contact. The conductive layer of the cover member 350 and the DDI 140 may be electrically separated from each other by an insulating layer.

In an embodiment, the conductive layer of the cover member 350 may be disposed over at least part of the substrate layer 160 and at least part of the metal layer 120. The conductive layer may extend toward the substrate layer 160 on at least the partial area. For example, the conductive layer may extend in the Y-axis direction that is the direction in which the substrate layer 160 is disposed, from the lower areas of the both side edges. The conductive layer may extend to at least partly overlap with the substrate layer 160. While extending over the substrate layer 160, the conductive layer may be disposed on the metal layer 120 between the bending part 130 and the substrate layer 160.

In an embodiment, the substrate layer 160 may include a printed circuit board (PCB) ground 164 or 166 and a plurality of wires (e.g., the wire(s) 162). The plurality of wires (e.g., the wire(s) 162) may constitute a PCB circuit and a PCB wire. The PCB ground 164 or 166 may operate as a ground layer that becomes the reference of various signals and voltages generated in the substrate layer 160. The PCB circuit may generate various signals and voltages generated in the substrate layer 160. The PCB wire may transmit various signals and voltages generated by the PCB circuit, to the display panel 110.

In an embodiment, the wire may be positioned in an area extending to the substrate layer 160, in the bending part 130. The wire positioned in the bending part 130 may connect the DDI 140 to the substrate layer 160. The wire positioned in the bending part 130 may also be affected by static electricity or impact. As such, the cover member 350 may be formed on the wire positioned in an area extending to the substrate layer 160 in the bending part 130.

In an embodiment, the protective layer may be disposed on the substrate layer 160. The protective layer may cover the wire(s) 162 of the substrate layer 160. The protective layer may cover the PCB wire. The protective layer may cover the PCB circuit. The protective layer may expose the PCB ground 164 or 166 of the substrate layer 160. The PCB ground 164 or 166 may be generated by removing at least part of the protective layer.

In an embodiment, the PCB ground 164 or 166 may be provided in a dummy area that is an area in which the wire(s) 162 are not disposed, in the internal area of the substrate layer 160. The dummy area may be formed in at least one side edge of the substrate layer 160. The PCB ground 164 or 166 may be disposed in the edges of the opposite sides of the substrate layer 160 corresponding to the dummy area. The PCB ground 164 or 166 may be disposed to be inclined to one side with respect to the X-axis direction.

In an embodiment, the conductive layer of the cover member 350 may extend in the direction of the substrate layer 160 and may be connected to the PCB ground 164 or 166. For example, the conductive layer may extend in the Y-axis direction at opposite sides in the lower edge and may be connected to the PCB ground 164 or 166. However, an embodiment is not limited thereto. The conductive layer may extend from at least part of the periphery and may be connected to the PCB ground 164 or 166. The conductive layer may be electrically connected to the PCB ground 164 or 166 to transmit the charge at a periphery of the cover member 350 to the PCB ground 164 or 166.

In an embodiment, the PCB ground 164 or 166 may be connected to the metal layer 120. The PCB ground 164 or 166 may transmit the charge transmitted from the conductive layer of the cover member 350, to the metal layer 120. The PCB ground 164 or 166 may form the EEP for discharging the static electricity to the metal layer 120.

In an embodiment, the EEP may be formed from the conductive layer of the cover member 350 to the metal layer 120 via the PCB ground 164 or 166. The EEP may be formed not to overlap with the DDI 140. The EEP may be formed spaced from the DDI 140.

Figure 9:
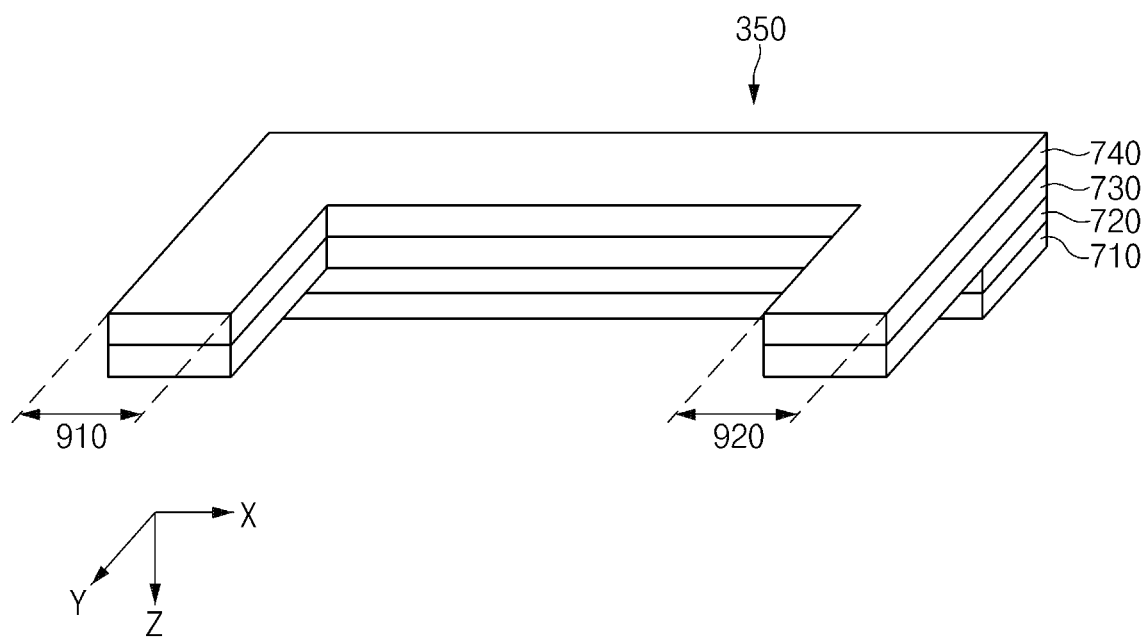
FIG. 9 is a view illustrating a cover member, according to an embodiment of the disclosure.

FIG. 9 is a view illustrating a cover member, according to an embodiment of the disclosure. The cover member 350 may include an adhesive layer 710, an insulating layer 720, a conductive layer 730, and a light-shielding layer 740. Because the adhesive layer 710, the insulating layer 720, and the light-shielding layer 740 of the cover member 350 according to another embodiment are substantially the same as the adhesive layer 240, the insulating layer 250, and the light-shielding layer 260 of the cover member 150, the descriptions thereof may be omitted.

Referring to FIG. 9, the area size of the conductive layer 730 may be wider than the area size of each of the adhesive layer 710 and the insulating layer 720. The conductive layer 730 may extend from at least part of a periphery to be longer than the adhesive layer 710 and the insulating layer 720. For example, the conductive layer 730 may extend in the Y-axis direction from opposite sides of the lower periphery in the periphery of the conductive layer 730. At least part of the edge area of the conductive layer 730 may have first and second extending parts 910 and 920 extending in the Y-axis direction. The first extending part 910 may be disposed in one side edge of the conductive layer 730, and the second extending part 920 may be disposed in the other side edge. However, an embodiment is not limited thereto. The conductive layer 730 may have the at least one extending part that does not overlap with the adhesive layer 710 and the insulating layer 720.

In an embodiment, the first and second extending parts 910 and 920 may be spaced from the DDI 140. In more detail, the first and second extending parts 910 and 920 may be spaced from the logic block 141 and the gamma block 142 included in the DDI 140. Moreover, the first and second extending parts 910 and 920 may be spaced from the area of the wire(s) 162 included in the substrate layer 160. The conductive layer 730 of the first and second extending parts 910 and 920 may form an EEP (e.g., the EEP of FIG. 3) that connects between the cover member 350 and the metal layer 120. The electronic device 300 may discharge the charge at a periphery of the cover member 350 to the metal layer 120 via the conductive layer 730 of the first and second extending parts 910 and 920. The first and second extending parts 910 and 920 may be connected to the ground of the substrate layer 160. As such, the first and second extending parts 910 and 920 may discharge static electricity to the metal layer 120. The EEP may be spaced from the DDI 140. In more detail, the EEP may be spaced from the logic block 141 and the gamma block 142 included in the DDI 140. In addition, the EEP may be spaced from the area of the wire(s) 162 included in the substrate layer 160.

In an embodiment, the conductive layer 730 may block the external noise applied to the DDI 140 or the noise generated from the DDI 140. The conductive layer 730 may discharge the external noise to the metal layer 120 such that the external noise applied to the DDI 140 does not affect the DDI 140. The conductive layer 730 may discharge the noise generated from the DDI 140, to the metal layer 120.

Figure 10:
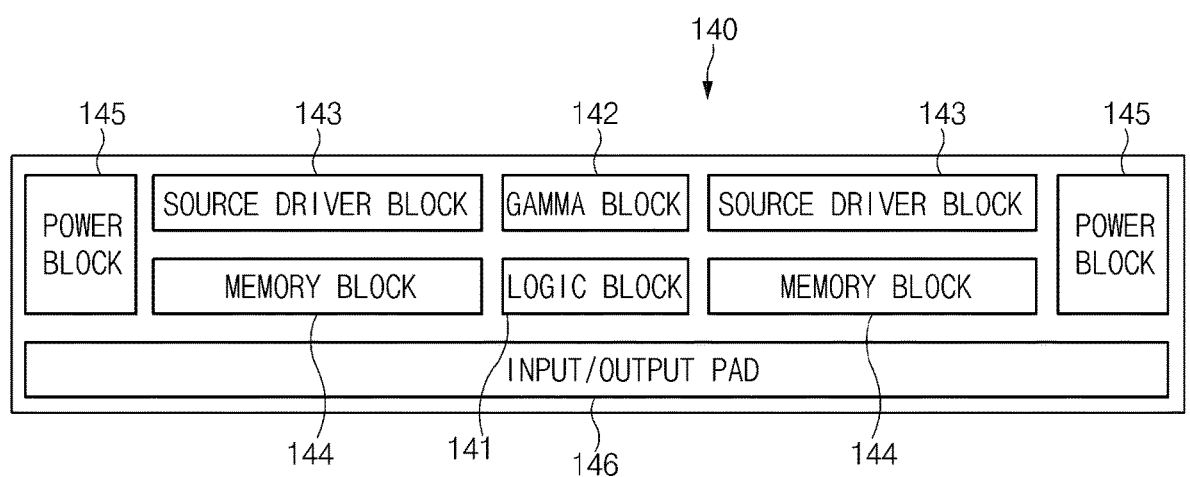
FIG. 10 is a block diagram illustrating a display driver integrated circuit (DDI), according to an embodiment of the disclosure.

FIG. 10 is a block diagram illustrating a DDI, according to an embodiment of the disclosure.

Referring to FIG. 10, the DDI 140 may include the logic block 141, the gamma block 142, a source driver block 143, a memory block 144, a power block 145, and an input/output pad 146.

In an embodiment, the logic block 141 and the gamma block 142 may be positioned at the center of the DDI 140. The memory block 144 may be positioned at the opposite sides of the logic block 141. The source driver block 143 may be positioned at the opposite sides of the gamma block 142. The power block 145 may be positioned at the edges of the opposite sides of the DDI 140.

In an embodiment, the logic block 141 may control the source driver block 143, using a plurality of signals provided from the input/output pad 146. The logic block 141 may be a timing controller that supplies image data for displaying an image and a plurality of timing signals for setting operation timing of the source driver block 143. The logic block 141 may receive control information and image data from a processor (e.g., application processor (AP)). The control information may refer to data for controlling components included in the DDI 140 or for selecting the image data. The image data may refer to data associated with an image output through the display panel 110.

In an embodiment, the logic block 141 may generate a clock based on the control information. The clock may refer to electrical vibration applied to the components to operate components (e.g., a gate driver and a data driver) included in the DDI 140 at a constant speed. The components may operate based on the clock generated by the logic block 141.

In an embodiment, the logic block 141 may generate a gate control signal GCS for controlling the gate driver. The gate control signal may include a signal for controlling a point in time when the gate driver applies a voltage to the gate lines and a signal for controlling a period in which the voltage is applied.

In an embodiment, the logic block 141 may transmit the image data provided from the input/output pad 146, to the source driver block 143. The logic block 141 may store the image data provided from the input/output pad 146, in the memory block 144.

In an embodiment, magnetic field may occur around the EEP. When the EEP is formed adjacent to the DDI 140, the DDI 140 may be affected by the magnetic field according to the flow of charge. When the EEP is formed adjacent to the logic block 141, because the logic block 141 is affected by the magnetic field, an error may occur in the image data provided by the logic block 141, thereby deteriorating the quality of the image.

In an embodiment, the electronic device 100 may discharge static electricity from the first conductive layer 210 included in the cover member 150 to the metal layer 120, without going via a separate layer between the cover member 150 and the metal layer 120. The electronic device 100 may form the EEP for discharging charge to the metal layer 120 via second and third conductive layers 220 and 230 spaced from the DDI 140. When the EEP is spaced from the DDI 140, the DDI 140 may not be affected by the magnetic field. As such, it is possible to prevent an error occurring in the image data of the logic block 141.

In an embodiment, the gamma block 142 may generate a gray scale voltage, using gamma data stored in an internal register. The gray scale voltage may refer to the voltage for correcting the sensitivity of the user's eyes. For example, even though the brightness of light emitted from a pixel changes linearly, the user may feel the change in brightness of the light nonlinearly. The gray scale voltage may mean a voltage for correcting the above-mentioned nonlinear characteristic.

In an embodiment, the source driver block 143 may convert the image data into data voltage. The data voltage may refer to a voltage capable of charging a capacitive element (e.g., a capacitor) included in pixels. The source driver block 143 may supply the data voltage to the pixels. When capacitive elements included in the pixels are charged and then current flows into a light-emitting element by the charged voltage, the pixels may emit light.

In an embodiment, the memory block 144 may store image data obtained from the logic block 141. The memory block 144 may sort the stored image data in output order. The memory block 144 may sequentially output the sorted image data to the source driver block 143.

In an embodiment, the power block 145 may generate the power to be supplied to the inside of the DDI 140. The power block 145 may generate the voltage (e.g., VDD voltage) for driving the source driver block 143. The power block 145 may generate the voltage (e.g., gamma reference voltage) for driving the gamma block 142.

In an embodiment, the power block 145 may include a step-up circuit and a regulator. The step-up circuit may receive the voltage from the input/output pad 146. The step-up circuit may increase the magnitude of the received voltage. The regulator may adjust the magnitude of the voltage, which is increased by the step-up circuit, and then may output the adjusted result.

In an embodiment, the input/output pad 146 may be connected to the substrate layer 160. The input/output pad 146 may receive the power from the substrate layer 160. The input/output pad 146 may obtain a plurality of control signals and a plurality of data signals, from the substrate layer 160.

Figure 11:
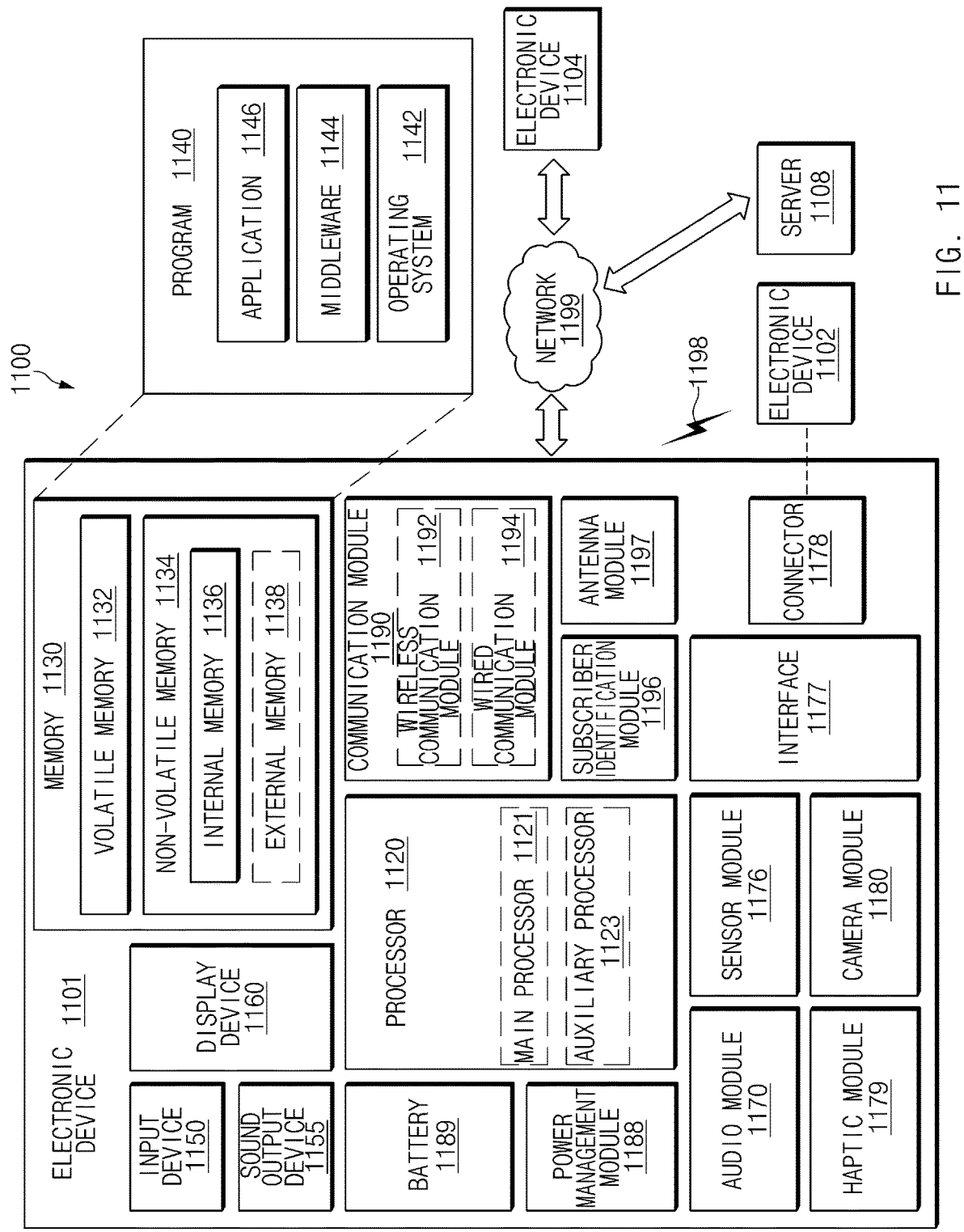
FIG. 11 illustrates an electronic device in a network environment having a structure for protecting a DDI from static electricity, according to an embodiment of the disclosure.

FIG. 11 is a block diagram illustrating an electronic device in a network environment according to an embodiment of the disclosure.

Referring to FIG. 11, an electronic device 1101 in a network environment 1100 may communicate with an external electronic device 1102 via a first network 1198 (e.g., a short-range wireless communication network), or an external electronic device 1104 or a server 1108 via a second network 1199 (e.g., a long-range wireless communication network). According to an embodiment, the electronic device 1101 may communicate with the external electronic device 1104 via the server 1108. According to an embodiment, the electronic device 1101 may include a processor 1120, a memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments, at least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in a volatile memory 1132, process the command or the data stored in the volatile memory 1132, and store resulting data in a non-volatile memory 1134. According to an embodiment, the processor 1120 may include a main processor 1121 (e.g., a central processing unit (CPU) or an AP), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an ISP or a CP) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other components (e.g., the processor 1120) of the electronic device 1101, from the outside (e.g., a user) of the electronic device 1101. The input device 1150 may include, for example, a microphone, a mouse, or a keyboard.

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., the external electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the external electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal (e.g., connector 1178) may include a connector via which the electronic device 1101 may be physically connected with the external electronic device (e.g., the external electronic device 1102). According to an embodiment, the connecting terminal (e.g., connector 1178) may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the external electronic device 1102, the external electronic device 1104, or the server 1108) and performing communication via the established communication channel. The communication module 1190 may include one or more CPs that are operable independently from the processor 1120 (e.g., the AP) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, Wi-Fi direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include one or more antennas, and, therefrom, at least one antenna appropriate for a communication scheme used in the communication network, such as the first network 1198 or the second network 1199, may be selected, for example, by the communication module 1190 (e.g., the wireless communication module 1192). The signal or the power may then be transmitted or received between the communication module 1190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the external electronic devices 1102 and 1104 may be a device of a same type as, or a different type, from the electronic device 1101. According to an embodiment, all or some of operations to be executed at the electronic device 1101 may be executed at one or more of the external electronic devices 1102 and 1104 or the server 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

Figure 12:
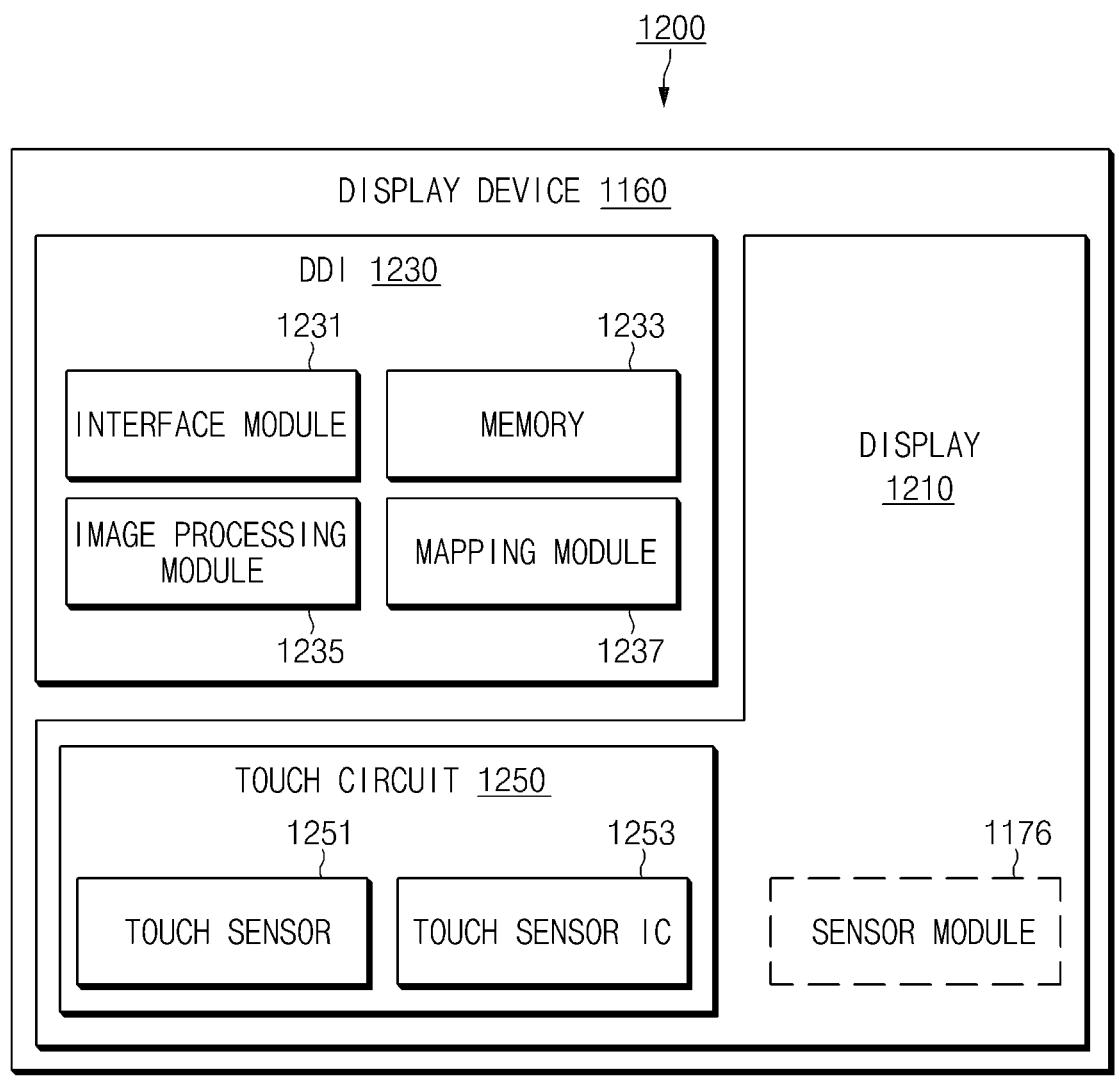
FIG. 12 is a block diagram of a display device having a structure for protecting a DDI from static electricity, according to an embodiment of the disclosure.

FIG. 12 is a block diagram illustrating a display device according to an embodiment of the disclosure.

Referring to FIG. 12, block diagram 1200 illustrates that the display device 1160 may include a display 1210 and a DDI 1230 to control the display 1210. The DDI 1230 may include an interface module 1231, a memory 1233 (e.g., buffer memory), an image processing module 1235, or a mapping module 1237. The DDI 1230 may receive image information that contains image data or an image control signal corresponding to a command to control the image data from another component of the electronic device 1101 via the interface module 1231. For example, according to an embodiment, the image information may be received from the processor 1120 (e.g., the main processor 1121 (e.g., an application processor)) or the auxiliary processor 1123 (e.g., a GPU) operated independently from the function of the main processor 1121. The DDI 1230 may communicate, for example, with touch circuitry (e.g., the input device 1150) or the sensor module 1176 via the interface module 1231. The DDI 1230 may also store at least part of the received image information in the memory 1233, for example, on a frame by frame basis.

The image processing module 1235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 1210.

The mapping module 1237 may generate a voltage value or a current value corresponding to the image data pre-processed or post-processed by the image processing module 1235. According to an embodiment, the generating of the voltage value or current value may be performed, for example, based at least in part on one or more attributes of the pixels (e.g., an array, such as a red, green, and blue (RGB) stripe or a pentile structure, of the pixels, or the size of each subpixel). At least some pixels of the display 1210 may be driven, for example, based at least in part on the voltage value or the current value such that visual information (e.g., a text, an image, or an icon) corresponding to the image data may be displayed via the display 1210.

According to an embodiment, the display device 1160 may further include a touch circuit 1250. The touch circuit 1250 may include a touch sensor 1251 and a touch sensor integrated circuit (IC) 1253 to control the touch sensor 1251. The touch sensor IC 1253 may control the touch sensor 1251 to sense a touch input or a hovering input with respect to a certain position on the display 1210. To achieve this, for example, the touch sensor 1251 may detect (e.g., measure) a change in a signal (e.g., a voltage, a quantity of light, a resistance, or a quantity of one or more electric charges) corresponding to the certain position on the display 1210. The touch circuit 1250 may provide input information (e.g., a position, an area, a pressure, or a time) indicative of the touch input or the hovering input detected via the touch sensor 1251 to the processor 1120. According to an embodiment, at least part (e.g., the touch sensor IC 1253) of the touch circuit 1250 may be formed as part of the display 1210 or the DDI 1230, or as part of another component (e.g., the auxiliary processor 1123) disposed outside the display device 1160.

According to an embodiment, the display device 1160 may further include at least one sensor (e.g., a fingerprint sensor, an iris sensor, a pressure sensor, or an illuminance sensor) of the sensor module 1176 or a control circuit for the at least one sensor. In such a case, the at least one sensor or the control circuit for the at least one sensor may be embedded in one portion of a component (e.g., the display 1210, the DDI 1230, or the touch circuitry (e.g., the input device 1150)) of the display device 1160. For example, when the sensor module 1176 embedded in the display device 1160 includes a biometric sensor (e.g., a fingerprint sensor), the biometric sensor may obtain biometric information (e.g., a fingerprint image) corresponding to a touch input received via a portion of the display 1210. As another example, when the sensor module 1176 embedded in the display device 1160 includes a pressure sensor, the pressure sensor may obtain pressure information corresponding to a touch input received via a partial or whole area of the display 1210. According to an embodiment, the touch sensor 1251 or the sensor module 1176 may be disposed between pixels in a pixel layer of the display 1210, or over or under the pixel layer.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment of the disclosure, an electronic device may discharge static electricity to a metal layer, using at least one conductive layer included in a cover member. The electronic device may discharge static electricity from at least one conductive layer included in the cover member to a metal layer without going via a separate layer, by connecting between a cover member and a metal layer at at least one point spaced from a DDI. As such, the electronic device may protect a DDI from impact by static electricity and may prevent the DDI from being affected depending on EMI.

In addition, an electronic device may form a path for discharging charge using a metal layer. An electronic device may allow the path for discharging charge entered into the electronic device to be formed along the metal layer without being formed along the cover member due to static electricity, and thus the path for discharging the static electricity is spaced from the DDI. As such, the electronic device may prevent the magnetic field generated from the path for discharging the static electricity, from affecting the DDI, thereby preventing an error from occurring in image data provided by a logic block.

Besides, a variety of effects directly or indirectly understood through this disclosure may be provided.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a display panel;
a metal layer disposed on a surface of the display panel;
a display driver integrated circuit (DDI) disposed on a surface of the metal layer;
a bending part connecting the display panel to the DDI; and
a cover member connected to the metal layer while covering the DDI,
wherein the cover member comprises at least one conductive layer,
wherein the metal layer and the cover member form a space in which the DDI is disposed, and
wherein the bending part is connected to the DDI via a connection part in the space.

2. The electronic device of claim 1,
wherein the cover member and the metal layer are in contact with each other at at least one point,
wherein an electrostatic path (EEP) via the at least one point is formed, and
wherein the EEP connects the cover member to the metal layer.

3. The electronic device of claim 1, wherein the cover member further comprises:
a first conductive layer extending from a first point of the metal layer to a second point of the metal layer and covering the DDI; and
a second conductive layer disposed at the first point and the second point and connecting the first conductive layer to the metal layer.

4. The electronic device of claim 3,
wherein the cover member further comprises a third conductive layer interposed between the first conductive layer and the second conductive layer, and
wherein the cover member substantially shields the DDI.

5. The electronic device of claim 3, wherein the cover member further comprises:
an adhesive layer disposed on the DDI; and
an insulating layer interposed between the first conductive layer and the adhesive layer.

6. The electronic device of claim 3, wherein the second conductive layer is spaced apart from the DDI and the bending part.

7. The electronic device of claim 3, wherein a first electrostatic path (EEP) facing toward the metal layer via the first conductive layer and the second conductive layer at the first point and a second EEP facing toward the metal layer via the first conductive layer and the second conductive layer at the second point are formed.

8. The electronic device of claim 1,
wherein a substrate layer is connected to one side of the bending part, and
wherein the substrate layer is spaced apart from the cover member.

9. The electronic device of claim 1,
wherein the bending part extends from the display panel and at least part of an area of the bending part is bent, and
wherein the bending part is disposed in at least part of an area of an upper surface or a lower surface of the metal layer while surrounding one side of the metal layer.

10. An electronic device comprising:
a display panel;
a metal layer disposed on a surface of the display panel and electrically connected to a ground terminal of the electronic device; and
one or more wires electrically connected to the display panel,
wherein the one or more wires comprise:
 a substrate layer electrically connected to a display driver integrated circuit (DDI) operating the display panel, and
 a conductive layer disposed on at least part of the substrate layer and at least part of the metal layer while covering the DDI,
wherein the conductive layer is electrically connected to the at least part of the metal layer.

11. The electronic device of claim 10, wherein the conductive layer extends from at least one point spaced from the DDI and is electrically connected to the metal layer at the at least one point.

12. The electronic device of claim 10, wherein the substrate layer is electrically connected to the display panel.

13. The electronic device of claim 10, wherein the conductive layer extends toward the substrate layer from at least one edge spaced from the DDI.

14. The electronic device of claim 10, further comprising:
an adhesive layer adhering the conductive layer to the DDI; and
an insulating layer interposed between the conductive layer and the adhesive layer.

15. The electronic device of claim 12, wherein the conductive layer blocks external noise applied to the DDI or noise generated from the DDI.

16. An electronic device comprising:
a display panel;
a metal layer disposed on a surface of the display panel;
a substrate layer disposed on a surface of the metal layer and electrically connected to the display panel;
a bending part extending from one side of the display panel, surrounding one side of the metal layer, and being connected to the substrate layer via a first portion of the surface of the metal layer;
a display driver integrated circuit (DDI) disposed on the first portion; and
a cover member covering the DDI,
wherein the cover member is electrically connected to the metal layer while being spaced from the DDI and the bending part.

17. The electronic device of claim 16, wherein the cover member extends to at least one point spaced from the substrate layer, is in contact with the metal layer at the at least one point, and shields the DDI.

18. The electronic device of claim 16, wherein the cover member comprises:
an insulating layer disposed on the DDI;
a conductive layer disposed on the insulating layer and a ground part; and
an adhesive layer coupling the insulating layer to the DDI.

19. The electronic device of claim 16, further comprising:
a protective layer disposed on the substrate layer,
wherein the protective layer covers a printed circuit board (PCB) wire of the substrate layer and a PCB circuit of the substrate layer and exposes a PCB ground of the substrate layer.

20. The electronic device of claim 19,
wherein a path for discharging static electricity that starts from the cover member, goes via the PCB ground, and faces toward the metal layer is formed, and
wherein the path for discharging the static electricity does not go via the PCB wire and the PCB circuit.

\* \* \* \* \*